United States Patent
Boyd et al.

(10) Patent No.: US 7,128,279 B2
(45) Date of Patent: Oct. 31, 2006

(54) METHOD AND APPARATUS FOR FLUID DELIVERY TO A BACKSIDE OF A SUBSTRATE

(75) Inventors: John M. Boyd, Atascadero, CA (US); Carl Woods, Aptos, CA (US)

(73) Assignee: Lam Research Corporation, Fremont, CA (US)

( * ) Notice: Subject to any disclaimer, the term of this patent is extended or adjusted under 35 U.S.C. 154(b) by 262 days.

(21) Appl. No.: 10/758,029

(22) Filed: Jan. 14, 2004

(65) Prior Publication Data

US 2004/0144862 A1 Jul. 29, 2004

Related U.S. Application Data

(62) Division of application No. 10/186,941, filed on Jun. 28, 2002, now Pat. No. 6,702,202.

(51) Int. Cl.
*B05B 3/00* (2006.01)
(52) U.S. Cl. .................. 239/225.1; 239/222; 239/504; 239/548; 134/144; 134/902
(58) Field of Classification Search ............. 239/225.1, 239/222, 504, 548, 302, 499, 518, 524, 596; 134/144, 902, 148, 176, 179, 198; 15/77
See application file for complete search history.

(56) References Cited

U.S. PATENT DOCUMENTS

| | | | | |
|---|---|---|---|---|
| 3,229,913 A | * | 1/1966 | Waldrum | 239/225.1 |
| 5,020,200 A | * | 6/1991 | Mimasaka et al. | 29/25.01 |
| 5,636,401 A | * | 6/1997 | Yonemizu et al. | 15/77 |
| 5,868,866 A | * | 2/1999 | Maekawa et al. | 134/34 |
| 6,193,798 B1 | * | 2/2001 | Sumnitsch | 118/52 |
| 6,197,150 B1 | * | 3/2001 | Kwag et al. | 156/345.23 |
| 6,419,170 B1 | * | 7/2002 | Wong | 239/587.1 |
| 6,539,952 B1 | * | 4/2003 | Itzkowitz | 134/1.3 |
| 6,824,621 B1 | * | 11/2004 | Shibagaki | 134/26 |

* cited by examiner

Primary Examiner—Dinh Q. Nguyen
Assistant Examiner—Darren Gorman
(74) Attorney, Agent, or Firm—Martine Penilla & Gencarella, LLP

(57) ABSTRACT

A fluid delivery device for delivering fluid to the backside of a substrate while minimizing waste is provided. The device includes an inner cylindrical tube having a top opening and a bottom opening. An upper cap overlying a top portion of the inner cylindrical tube is included. The upper cap is moveably disposed over the inner cylindrical tube. The upper cap includes a top with at least one hole defined therein. The top includes a sidewall extending therefrom. A system and a method for reducing an amount of a cleaning chemistry applied to a backside of a wafer during a cleaning operation are also provided.

8 Claims, 6 Drawing Sheets

METHOD AND APPARATUS FOR FLUID DELIVERY TO A BACKSIDE OF A SUBSTRATE

CROSS REFERENCE TO RELATED APPLICATIONS

This application is a divisional application of prior U.S. patent application Ser. No. 10/186,941 filed on Jun. 28, 2002 now U.S. Pat. No. 6,702,202 entitled "METHOD AND APPARATUS FOR FLUID DELIVERY TO A BACKSIDE OF A SUBSTRATE", which is herein incorporated by reference in its entirety for all purposes.

BACKGROUND OF THE INVENTION

The present invention relates generally to semiconductor fabrication and, more particularly, to a method and apparatus for reducing consumption of fluid delivered to a backside of a substrate during a cleaning operation.

Cleaning chemistries for single wafer cleaning operations are formulated for specific applications and are designed so that a small amount of the chemistry applied to the surface of the wafer is sufficient for cleaning the surface of the wafer. That is, a thin film of the fluid supplied to the surface of the wafer produces the desired cleaning effects. Because of the high costs for the purchase and the disposal of the cleaning chemistries, it is desired to only use the amount of chemistry that is necessary for effective cleaning.

Applying a thin film of the cleaning chemistry to a top surface of a semiconductor substrate is easily accomplished as gravity is working to assist the process. A small amount of fluid can be puddled on a top surface of the substrate and the substrate can be rotated around its axis to spread the fluid over the surface of the substrate without spinning the fluid off of the wafer surface. The speed of the rotation can be used to control the thickness of the fluid layer. However, the cleaning chemistry can not be applied to the backside of the wafer in this manner as the fluid will be lost. FIG. 1 is a schematic diagram of a wafer having cleaning chemistries applied to a top and a backside of the wafer. Wafer 100 has a thin film applied to a top surface of the wafer by top nozzle 104*a*. However, bottom surface 106 can not retain the fluid from bottom nozzle 104*b*, where as much as 95% of the fluid delivered to bottom surface 106 can be lost. Thus, conventional spray-on techniques are not effective for low-volume chemistry cleaning of the wafer backside.

One attempt to minimize the fluid loss associated with cleaning the backside of the wafer is to clean the top side of the wafer and then flip the wafer over to clean the other side. However, the throughput for the cleaning process is cut in half since the cleaning is performed sequentially. Accordingly, this alternative is not a viable one. Another attempt to address the shortcomings of the prior art is to provide a reservoir containing the cleaning chemistry and place the backside of the wafer in contact with a meniscus formed by the cleaning chemistry. FIG. 2 is schematic diagram of a wafer coming into contact with a meniscus of a cleaning solution in a reservoir. Bottom surface 106 of wafer 100 is brought into contact with meniscus 108. Meniscus 108 is formed when the cleaning chemistry is filled to the top of reservoir 110. However, a shortcoming with the use of a reservoir is due to each of the cleaning solutions having different surface tensions. Thus, the meniscus height can be different for each of the cleaning chemistries. Consequently, the distance for the wafer to be brought into contact with the cleaning chemistry will change with the different cleaning chemistries. This configuration is also difficult to implement mechanically. Additionally, the contents of reservoir 110 will have to be changed over time as the cleaning chemistry becomes dirty, which negatively impacts throughput and control of contaminants.

In view of the foregoing, there is a need for a method and apparatus for reducing the volume of cleaning chemistry applied to the backside of a wafer in a single-wafer cleaning tool in a manner that does not negatively impact the throughput or defect rate.

SUMMARY OF THE INVENTION

Broadly speaking, the present invention fills this need by providing a nozzle and delivery system for applying a minimal amount of fluid to the backside of a semiconductor substrate. It should be appreciated that the present invention can be implemented in numerous ways, including as an apparatus, a system, a device, or a method. Several inventive embodiments of the present invention are described below.

In accordance with one aspect of the present invention, a nozzle is provided. The nozzle includes an inner cylindrical tube having a top opening and a bottom opening. An upper cap overlying a top portion of the inner cylindrical tube is included. The upper cap is moveably disposed over the inner cylindrical tube. The upper cap includes a top with at least one hole defined therein. The top includes a sidewall extending therefrom.

In accordance with another aspect of the invention, a fluid delivery system for cleaning a backside of a semiconductor substrate is included. The fluid delivery system includes a shaft configured to rotate about an axis of the shaft. An arm having a first end and a second end is included. The first end is affixed to the shaft and is in communication with a fluid source. A cap moveably disposed over the second end of the arm is included. The cap has a top with at least one hole defined therein. The top includes a sidewall extending therefrom. The sidewall extends over a portion of the second end of the arm.

In accordance with yet another aspect of the invention, a method for reducing an amount of a cleaning chemistry applied to a backside of a wafer during a cleaning operation is provided. The method initiates with positioning a nozzle having a moveable top under a backside of a wafer to be cleaned. Then, a fluid flow occurs through the moveable top to raise the moveable top into close proximity with the backside of the wafer. Next, a fluid barrier is created between a top surface of the moveable top and a backside of the wafer while the fluid flows through the moveable top. Then, the backside of the wafer is cleaned by the fluid barrier.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE INVENTION

Figure 1:
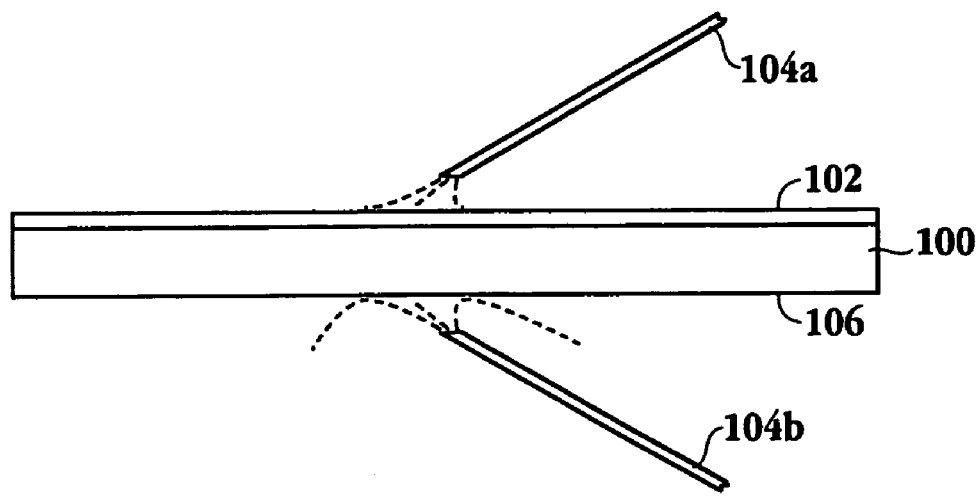
FIG. 1 is a schematic diagram of a wafer having cleaning chemistries applied to a top and a backside of the wafer.
Figure 2:
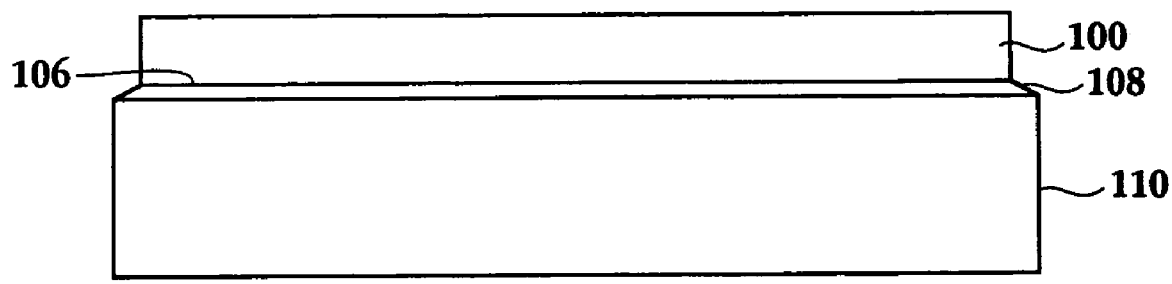
FIG. 2 is schematic diagram of a wafer coming into contact with a meniscus of a cleaning solution in a reservoir.

Several exemplary embodiments of the invention will now be described in detail with reference to the accompanying drawings. FIGS. 1 and 2 are discussed above in the "Background of the Invention" section. As used herein, the term about refers to a reasonable approximation of the specific range provided.

Figure 3:
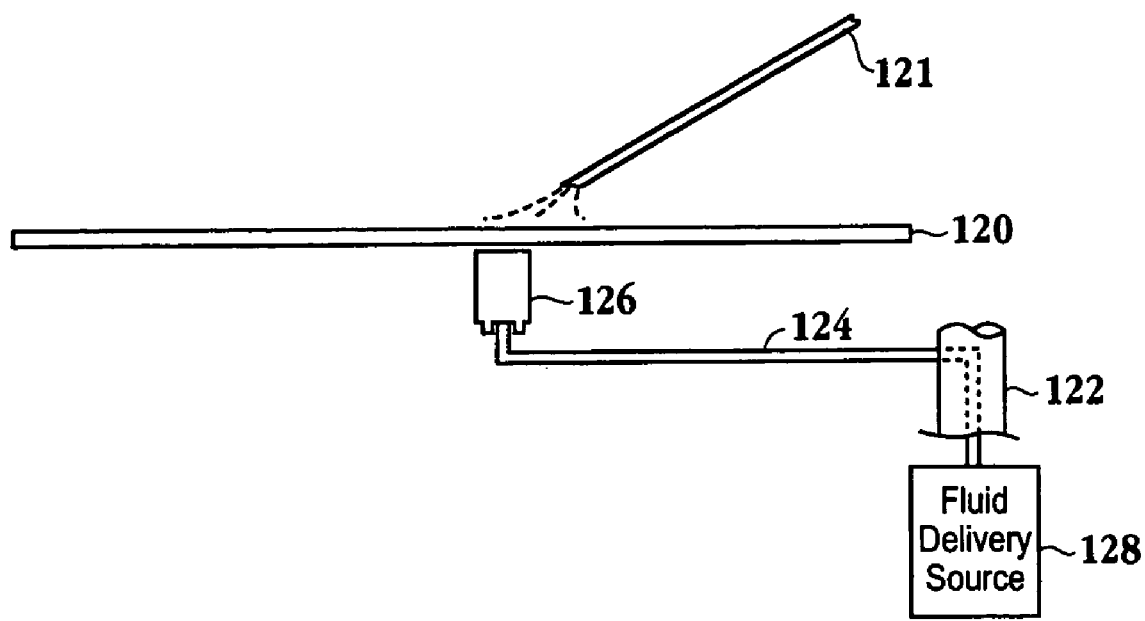
FIG. 3 is a simplified schematic diagram of a chemical delivery system in accordance with one embodiment of the invention.

FIG. 3 is a simplified schematic diagram of a chemical delivery system in accordance with one embodiment of the invention. Nozzle 126 is positioned under the backside of wafer 120. Nozzle 126 is disposed over an end of supply arm 124. In one embodiment, supply arm 124 is a cylindrical tube compatible with the cleaning chemicals used to clean the backside of wafer 120. It should be appreciated that supply arm 124 acts as an end effector. Another end of supply arm 124 is affixed to shaft 122. In one embodiment, shaft 122 rotates about its axis so that nozzle 126 can move in a radial direction under the backside of wafer 120. Fluid delivery source 128 is in communication with supply arm 124. One skilled in the art will appreciate that fluid delivery source 128 can include a pump for delivering a cleaning chemistry to the backside of wafer 120 through nozzle 126, in one embodiment.

It should be appreciated that wafer 120 can be cleaned after a semiconductor fabrication process, such as chemical mechanical planarization (CMP), etch operations, etc. Examples of single wafer cleaning chemistries commonly used for post-etch cleaning include commercially available proprietary chemicals, such as EKC 640, EKC 6800 and Ashland NE89. Commercially available non-proprietary chemicals used for post chemical mechanical planarization cleaning are generally known and include SC-1 ($NH_4OH$/$H_2O_2$ mixture), SC-2 ($HCl/H_2O_2$ mixture), dilute HF or ozonated DIW ($H_2O/O_3$).

Still referring to FIG. 3, top nozzle 121 can add a cleaning agent to the top surface of wafer 120 simultaneously while cleaning the backside of the wafer. Here, the same cleaning chemistry or a different cleaning chemistry can be added to each side of wafer 120. For example, where a post-etch cleaning operation is being performed on the top surface of wafer 120, there may be photoresist pieces deposited on the backside of the wafer which carried over from a lithography step. Accordingly, different chemistries can be applied to the top surface and the backside of wafer 120 simultaneously due to the efficiency enabled through the nozzle described herein. Thus, the system throughput can be increased by performing separate cleaning operation on the two sides of wafer 120 simultaneously.

Figure 4:
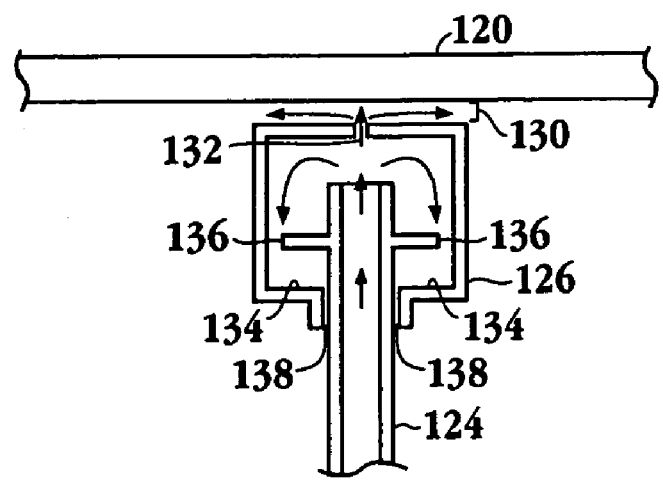
FIG. 4 is a cross-sectional schematic diagram of the nozzle of FIG. 3 in an activated state in accordance with one embodiment of the invention.

FIG. 4 is a cross-sectional schematic diagram of the nozzle of FIG. 3 in an activated state in accordance with one embodiment of the invention. Nozzle 126 is disposed over a top portion of supply arm 124. A degree of travel of nozzle 126 in an up and down direction is limited in one embodiment. That is, shoulder 134 of nozzle 126 is configured so as to be unable to move past protrusion 136 of supply arm 124. Here, supply arm 124 is fixed and protrusion 136 acts as a travel limiter for the moveable nozzle. Nozzle 126 moves to a raised position as fluid is delivered through supply arm 124. Nozzle 126 includes orifice 132 which is defined through a top surface of the nozzle. Orifice 132 is configured to provide some back-pressure, thereby causing nozzle 126 to raise while fluid is escaping through the orifice.

Still referring to FIG. 4, nozzle 126 continues to rise as fluid is provided from supply arm 124. Eventually, a thin film, i.e., fluid barrier, is defined between wafer 120 and a top surface of nozzle 126. The pressure exerted by nozzle 126 on the thin film, which has a thickness 130 defined between the backside of wafer 120 and a top surface of nozzle 126, becomes insufficient to further compress the thin film. In one embodiment, the thin film is composed of the cleaning chemistries mentioned above. It should be appreciated that the thin film acts as a fluid barrier and a fluid bearing as wafer 120 rotates and nozzle 126 is radially swept across the backside of the rotating wafer. Top surface of nozzle 126 is substantially flat and self-aligns to the backside of the wafer. The self alignment is due to the sliding mechanism of nozzle 126 over supply arm 124 caused by the flow rate and pressure at which the cleaning chemistry is delivered. It should be appreciated that the top surface of nozzle 126 does not physically contact the backside of the wafer 120. That is, the top surface of nozzle 126 is in contact with the backside of wafer 120 through the fluid barrier interface. Opposing surfaces of the fluid barrier physically contacts the backside of wafer 120 and a top surface of nozzle 126. Thus, should wafer 120 have a wobble or run-out as it rotates, nozzle 126 will accommodate the wobble and run out and not come in contact with the backside of the wafer. In one embodiment, the thin film between the backside of wafer 120 and a top surface of nozzle 126 has a thickness of between about 0.1 millimeter (mm) and about 2 mm.

It should be appreciated that a portion of the fluid delivered to nozzle 126 of FIG. 4 can escape through gap 138 between nozzle 126 and supply arm 124. Alternatively, the nozzle 126 and supply arm 124 can be machined so that gap 138 is minimized, i.e., the tolerance between the nozzle inner diameter at shoulder 134 and the supply arm outer diameter does not allow for the fluid to escape. The configuration of nozzle 126 allows for a lower flow rate to be applied because the losses of the fluid applied to the backside of the wafer are reduced. In one embodiment, a flow rate of between about 25 milliliters (ml) and about 50 ml is sufficient to supply the necessary backpressure to lift nozzle 126 and to create a fluid barrier Of course, the flow rate can change depending on the application, cleaning chemistry, pump, etc. Thus, the above flow rate is meant to be exemplary and not restrictive.

Figure 5A:
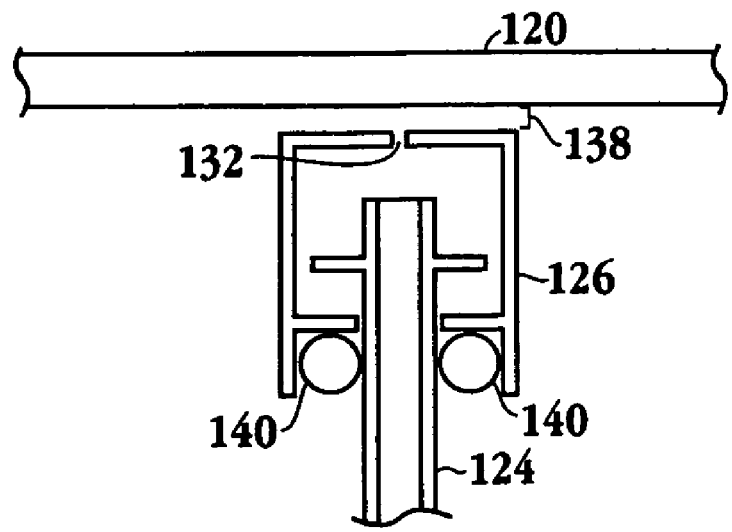
FIG. 5A is a cross-sectional view of a schematic diagram of a sealed nozzle in a relaxed state in accordance with one embodiment of the invention.

FIG. 5A is a cross-sectional view of a schematic diagram of a sealed nozzle in a relaxed state in accordance with one embodiment of the invention. Nozzle 126 is disposed over supply arm 124. As there is no fluid being delivered from supply arm 124, nozzle 126 is in a relaxed position. Thus, gap 142 between the backside of wafer 120 and a top surface of nozzle 126 is larger here. O-ring 140 acts as a seal between nozzle 126 and supply arm 124. It should be appreciated that the composition of O-ring 140 can be any material suitable for allowing the up and down motion of nozzle 126 and the material is chemically compatible with the cleaning chemistries. Similarly, the composition of nozzle 126 and supply tube 124 can be any material suitable for the cleaning process that is compatible with the cleaning chemicals.

Figure 5B:
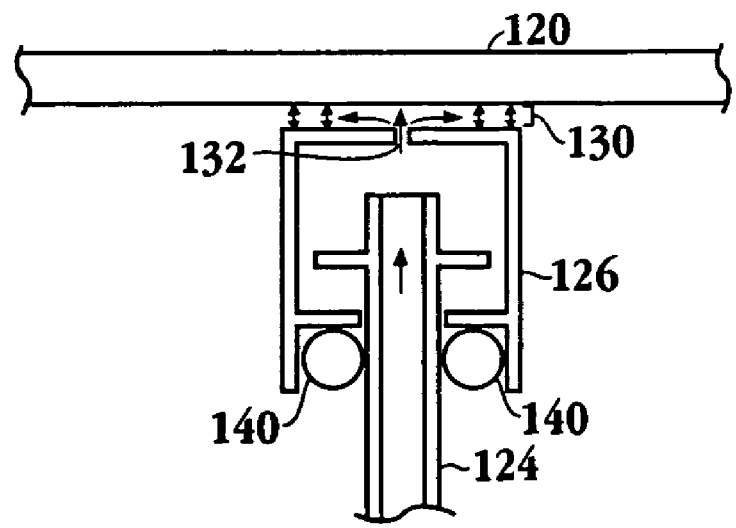
FIG. 5B is a cross-sectional view of a schematic diagram of the nozzle of the FIG. 5A in an active state.

FIG. 5B is a cross-sectional view of a schematic diagram of the nozzle of the FIG. 5A in an active state. Here, a fluid flow through supply arm 124 provides the pressure to raise nozzle 126 while fluid escapes through orifice 132. A fluid barrier is formed between the backside of wafer 120 and a top surface of nozzle 126. The fluid barrier also acts as a fluid bearing, which in essence allows for the top surface of nozzle 126 to be in contact with the backside of wafer 120 through the fluid barrier interface. In one embodiment, the fluid is a cleaning chemistry. For example a post-etch or post CMP cleaning chemistry can be delivered to nozzle 126 through supply arm 124 for cleaning the backside of wafer 120. O-ring 140 seals a gap between nozzle 126 and supply arm 124, thereby forcing the fluid through orifice 132 without restricting the movement of nozzle 126. In one embodiment, the flow rate of the cleaning chemistry from supply arm 124 is about less that 100 milliliters (ml)/minute. In a preferred embodiment, the flow rate is about less that 50 ml/minute.

Figure 6A:
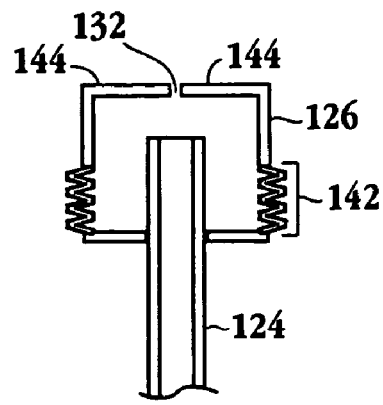
FIG. 6A is a cross-sectional view of a schematic diagram of a nozzle having a bellows seal in accordance with one embodiment of the invention.

FIG. 6A is a cross-sectional view of a schematic diagram of a nozzle having a bellows seal in accordance with one embodiment of the invention. Nozzle 126, which is disposed over an end of supply arm 124, includes bellows seal 142. As is known, bellows seal 142 contracts and expands as nozzle 126 moves from a relaxed state to an active state. It should be appreciated that there is no need for the protrusion and shoulders with reference to FIGS. 4, 5A and 5B, since bellows seal 142 acts as a travel limiter. In one embodiment, top surface 144 of nozzle 126 provides a substantially flat surface where the fluid, i.e., cleaning chemistry, can reside as the nozzle moves radially across the wafer and as the wafer rotates. While some fluid will be lost, the losses are significantly reduced as compared with spray-on techniques of the prior art. In addition, the flow of fluid through orifice 132 is constantly replenishing any losses and maintains the fluid barrier which cleans the backside of the wafer.

Figure 6B:
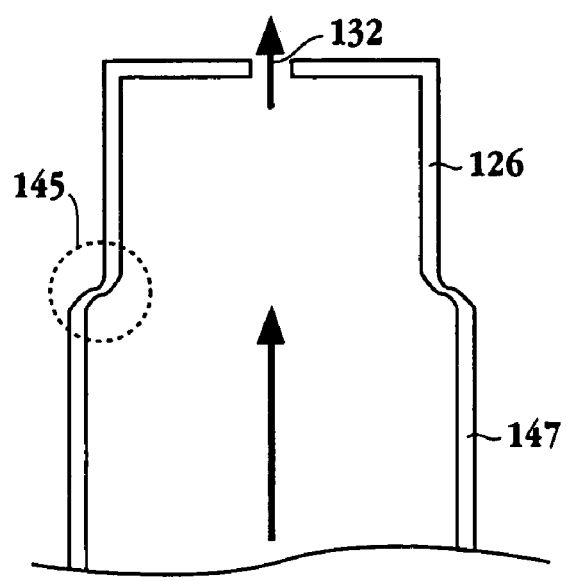
FIG. 6B is a cross-sectional view of a schematic diagram of a nozzle having a continuous wall with a thinned section in an extended position in accordance with another embodiment of the invention.

FIG. 6B is a cross-sectional view of a schematic diagram of a nozzle having a continuous wall with a thinned section in an extended position in accordance with another embodiment of the invention. Supply arm 147 is a continuous wall with thinned section 145. As fluid flows through opening 132 of nozzle 126, a back pressure forces the top portion of nozzle 126 to an extended state. Thinned section 145 acts as an extension point as it is flexible and the back pressure provides the necessary force to lift the top portion of nozzle 126 under a pressure or flow of fluid. In one embodiment, thinned section 145 has a thickness between about 0.01 mm and about 0.5 mm. Supply arm 147 can be fabricated from any suitable material such as plastic or metal that is compatible with the cleaning chemistries and is capable of being thinned while maintaining sufficient strength and pliability.

Figure 6C:
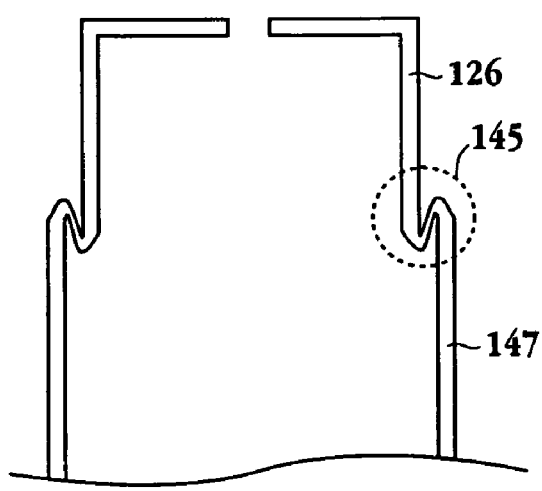
FIG. 6C is a cross-sectional view of a schematic diagram of the nozzle of FIG. 6B having a continuous wall with a thinned section in a retracted position.

FIG. 6C is a cross-sectional view of a schematic diagram of the nozzle of FIG. 6B having a continuous wall with a thinned section in a retracted position. Here, the flow of fluid causing the back pressure has been stopped and the top portion of nozzle 126 retracts. The retraction is due to the folding of thinned section 145 of supply arm 147. In one embodiment, the range of travel between full extension and full retraction is less than 2 millimeters.

Figure 7A:
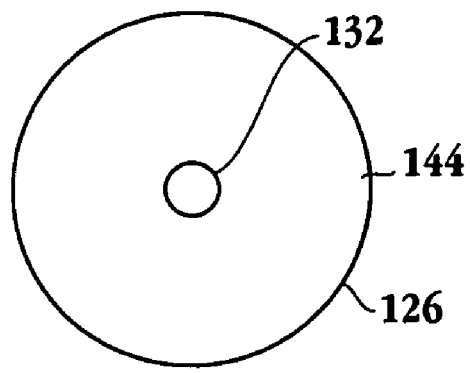
FIG. 7A is a top view of a nozzle for delivering a fluid to the backside of a wafer in accordance with one embodiment of the invention.

FIG. 7A is a top view of a nozzle for delivering a fluid to the backside of a wafer in accordance with one embodiment of the invention. Orifice 132 is substantially centered on top surface 144 of cylindrically shaped nozzle 126. Nozzle 126 can be referred to as a cap. It should be appreciated that orifice 132 has a suitable diameter for allowing enough back pressure to lift nozzle 126 while allowing a fluid flow out of the orifice to obtain a suitable fluid barrier. In one embodiment, the diameter of nozzle 126 is between about 5% and 30% of the diameter of the wafer being cleaned. In a preferred embodiment, the diameter of nozzle 126 is between about 25% of the diameter of the wafer being cleaned. In another embodiment, the diameter of the nozzle is configured to enable completion of the cleaning of the backside of the wafer within about 5 seconds, when the nozzle is moving radially across the wafer as the wafer is rotating.

Figure 7B:
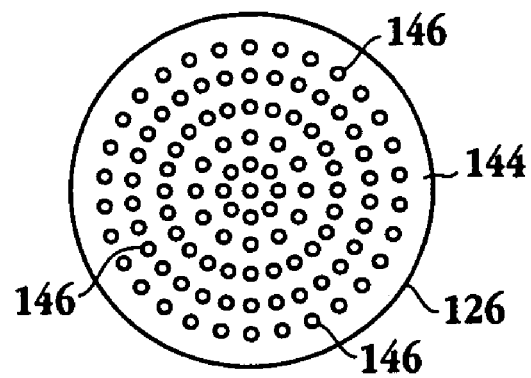
FIG. 7B is a top view of an alternative orifice arrangement to FIG. 7A.

FIG. 7B is a top view of an alternative orifice arrangement to FIG. 7A. Here, a plurality of orifices 146 are distributed over top surface 144 of nozzle 126. In one embodiment, orifices 146 have a diameter between about 0.5 millimeters (mm) and about 5 mm. The holes defined by orifices 146, have a suitable diameter for allowing enough back pressure to lift nozzle 126 while allowing a fluid flow out of the orifice to obtain a suitable fluid barrier. It will be apparent to one skilled in the art that any suitably-shaped hole or orifice can be used here.

Figure 7C:
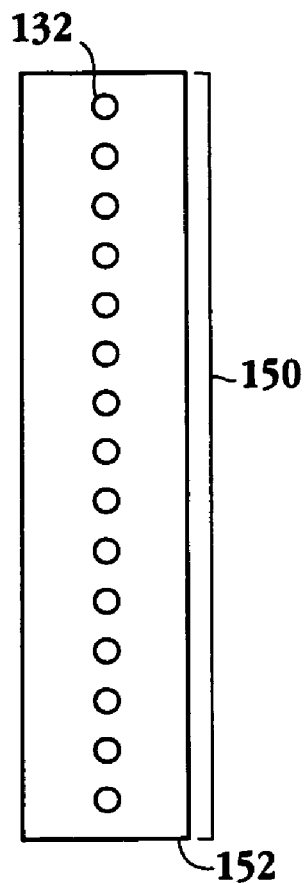
FIG. 7C is a top view of another alternative nozzle configuration in accordance with one embodiment of the invention.

FIG. 7C is a top view of another alternative nozzle configuration in accordance with one embodiment of the invention. Nozzle 152 is configured as an elongated cylinder having a plurality of orifices 132. In one embodiment, length 150 of nozzle 152 is slightly large than the radius of the wafer being cleaned. One skilled in the art will appreciate that by defining the length of the nozzle longer than a radius of the wafer, the backside of the wafer can be cleaned in one rotation of the wafer.

Figure 8:
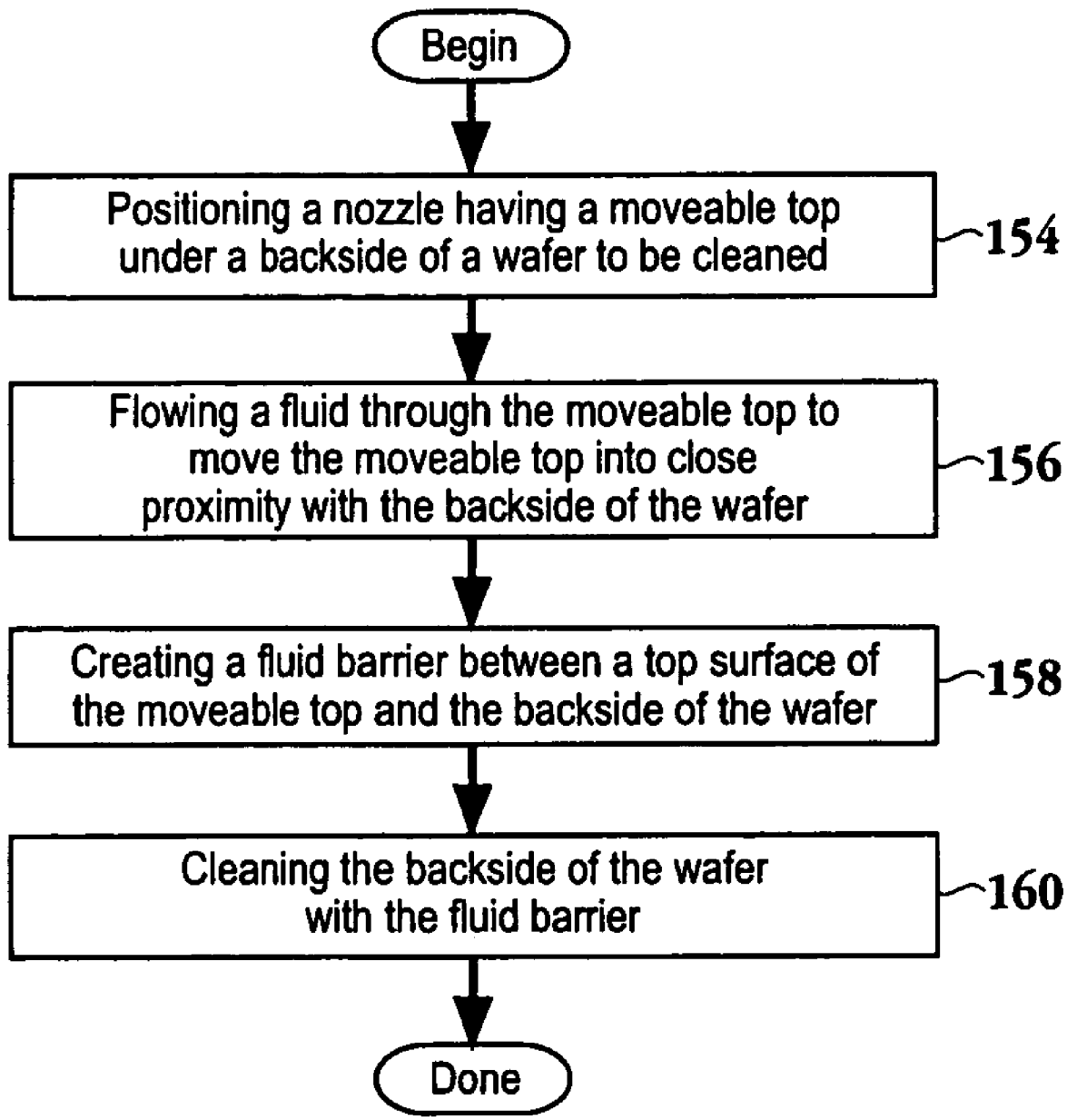
FIG. 8 is a flowchart of the method operations reducing an amount of a cleaning chemistry applied to a backside of a wafer during a cleaning operation in accordance with one embodiment of the invention.

FIG. 8 is a flowchart of the method operations reducing an amount of a cleaning chemistry applied to a backside of a wafer during a cleaning operation in accordance with one embodiment of the invention. The method initiates with operation 154 where a nozzle having a moveable top is positioned under a backside of a wafer. A suitable nozzle is described with reference to FIGS. 3–7C. The method then advances to operation 156 where a fluid flow through the moveable top moves the moveable top into close proximity with the backside of the wafer. The fluid flow causes a back pressure which in turn, lifts the moveable top towards the backside of the wafer. In one embodiment, the moveable top is limited in the amount of travel towards the backside of the wafer. In another embodiment, the moveable top slides along a fixed supply arm in a manner that allows the moveable top to self align to the backside of the wafer being cleaned.

The method of FIG. 8 then proceeds to operation 158 where a fluid barrier is created between the top surface of the moveable top and the backside of the wafer. Here, the fluid flow through an orifice in a top surface of the moveable top causes the moveable top to trap a fluid barrier between the backside of the wafer and the top surface. The fluid barrier acts as a fluid bearing as the wafer and the nozzle move. In one embodiment, the fluid is a post etch or post CMP cleaning chemistry. The method then advances to operation 160 where the backside of the wafer is cleaned with the fluid barrier. Here, the fluid barrier cleans the backside of the wafer since the nozzle is in close proximity to the backside of the wafer and the fluid flow maintains the fluid barrier. For example, the nozzle can be attached to a supply arm as described with reference to FIG. 3. Due to the configuration of the nozzle, with reference to FIGS. 4–6, the loss of the fluid is significantly reduced and the residence time of the fluid barrier can be controlled by the speed of the movement of the wafer and the nozzle. In one embodiment, where the surface area of the top surface of the nozzle is about 25% of the surface area of the backside of the wafer, the backside of the wafer is cleaned in about 5 seconds.

In summary, the present invention provides a nozzle configured to apply a thin coating of fluid, i.e., fluid barrier, to the backside of a wafer. In one embodiment, the thin coating of fluid is a cleaning chemistry for a post-etch cleaning or a post CMP cleaning. The nozzle makes use of an outer cylinder having an orifice on a top surface slidably disposed over a fixed inner cylinder in one embodiment. The sliding mechanism allows the nozzle to self align to the backside of the wafer. The top surface allows a fluid barrier to be formed so that the cleaning chemistry has a long enough residence time on the wafer backside to clean the wafer backside. In one embodiment, a system configured to perform different cleaning operations simultaneously on a top surface of a wafer and a bottom surface of a wafer in an efficient manner is enabled by the nozzle configuration. Thus, the throughput of the system is enhanced by performing different cleaning operations on the top and bottom surfaces of the wafer at the same time.

The invention has been described herein in terms of several exemplary embodiments. For example, representative shapes and sizes of the nozzle, i.e., cap, have been described herein, however any suitable shape and size nozzle can be used to apply the cleaning chemistry to the backside of the wafer. Other embodiments of the invention will be apparent to those skilled in the art from consideration of the specification and practice of the invention. The embodiments and preferred features described above should be considered exemplary, with the invention being defined by the appended claims.

What is claimed is:
1. A fluid delivery device, comprising:
an inner cylindrical tube having a top opening and a bottom opening; and
an upper cap overlying a top portion of the inner cylindrical tube, the upper cap moveably disposed over the inner cylindrical tube, the upper cap having a top with a plurality of holes defined therein, the top having a sidewall extending therefrom, wherein a fluid delivered to the bottom opening of the inner cylindrical tube at a flow rate of less than 100 ml per minute causes the upper cap to move vertically along an axis shared by the inner cylindrical tube and the upper cap.

2. The device of claim 1, wherein the top of the upper cap is substantially flat.

3. The device of claim 1, wherein an interior surface of the upper cap includes a protrusion and an exterior surface of the inner cylindrical tube includes a protrusion.

4. The device of claim 1, wherein a gap between an inner surface of the upper cap and an outer surface of the inner cylindrical tube is sealed.

5. The device of claim 4, wherein the gap is sealed by one of an 0-ring and a bellows seal.

6. The device of claim 1, wherein each of the plurality of holes has a diameter between about 0.5 millimeters (mm) and 5 mm.

7. The device of claim 1, wherein the upper cap and the inner cylindrical tube are one continuous unit having a common thinned section allowing a top portion of the nozzle to travel along an axis.

8. The device of claim 7, wherein the common thinned section has a thickness between about 0.01mm and 0.5mm.

* * * * *